United States Patent
Bedjaoui et al.

(10) Patent No.: US 11,152,605 B2
(45) Date of Patent: Oct. 19, 2021

(54) METHOD FOR MANUFACTURING A POSITIVE ELECTRODE FOR A SOLID-STATE LITHIUM MICROBATTERY

(71) Applicant: COMMISSARIAT À L'ÉNERGIE ATOMIQUE ET AUX ÉNERGIES ALTERNATIVES, Paris (FR)

(72) Inventors: Messaoud Bedjaoui, Grenoble (FR); Johnny Amiran, Grenoble (FR); Nicolas Lopez, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 248 days.

(21) Appl. No.: 16/276,113

(22) Filed: Feb. 14, 2019

(65) Prior Publication Data
US 2019/0260009 A1    Aug. 22, 2019

(30) Foreign Application Priority Data
Feb. 16, 2018 (FR) ...................... 1851346

(51) Int. Cl.
*H01M 4/08* (2006.01)
*C23C 14/08* (2006.01)
(Continued)

(52) U.S. Cl.
CPC ............ *H01M 4/08* (2013.01); *C23C 14/085* (2013.01); *C23C 14/34* (2013.01);
(Continued)

(58) Field of Classification Search
CPC ... C23C 14/085; C23C 14/34; C23C 14/5806; C23C 14/5873; H01M 4/0423;
(Continued)

(56) References Cited

U.S. PATENT DOCUMENTS

2004/0029311 A1* 2/2004 Snyder .................... H01L 24/01
438/106
2006/0286448 A1* 12/2006 Snyder ................ H01M 10/052
429/176
(Continued)

FOREIGN PATENT DOCUMENTS

WO    2017204859    11/2017

OTHER PUBLICATIONS

Search Report for French Application No. 1851346 dated Oct. 5, 2018.

*Primary Examiner* — Rodney G McDonald
(74) *Attorney, Agent, or Firm* — Pearne & Gordon LLP (57) ABSTRACT

Method for producing a positive electrode for a solid-state lithium microbattery comprising the following successive steps: supplying of a substrate made of ceramic, glass or silicon, locally covered with a metal layer, depositing of a cathodic layer made of a positive electrode material, for example made of mixed lithium oxide, the cathodic layer having a thickness greater than 1 μm, a first portion of the cathodic layer covering the substrate and a second portion of the cathodic layer covering the metal layer, intended to form the positive electrode, carrying out of a heat treatment at a temperature greater than or equal to 400° C., on the cathodic layer, in such a way as to crystallise the second portion of the cathodic layer in order to form a positive electrode, and in such a way as to delaminate the first portion of the cathodic layer.

20 Claims, 5 Drawing Sheets

(51) Int. Cl.
*C23C 14/34* (2006.01)
*C23C 14/58* (2006.01)
*H01M 4/04* (2006.01)
*H01M 4/525* (2010.01)
*H01M 6/18* (2006.01)
*H01M 4/1391* (2010.01)
*H01M 4/02* (2006.01)
*H01M 6/40* (2006.01)

(52) U.S. Cl.
CPC ...... *C23C 14/5806* (2013.01); *C23C 14/5873* (2013.01); *H01M 4/0423* (2013.01); *H01M 4/0426* (2013.01); *H01M 4/0471* (2013.01); *H01M 4/1391* (2013.01); *H01M 4/525* (2013.01); *H01M 6/185* (2013.01); *H01M 6/40* (2013.01); *H01M 2004/028* (2013.01)

(58) Field of Classification Search
CPC .... H01M 4/0426; H01M 4/0471; H01M 4/08; H01M 4/1391; H01M 4/525; H01M 2004/028; H01M 6/185; H01M 6/40; Y02E 60/10
USPC .......................... 204/192.12, 192.15, 192.17
See application file for complete search history.

(56) References Cited

U.S. PATENT DOCUMENTS

| | | | |
|---|---|---|---|
| 2015/0004470 A1* | 1/2015 | Bhardwaj | H01M 10/0585 429/152 |
| 2015/0221974 A1 | 8/2015 | Upadhyaya et al. | |
| 2017/0133166 A1* | 5/2017 | Oukassi | H01M 10/0525 |
| 2017/0288272 A1* | 10/2017 | Kwak | H01M 4/0421 |
| 2017/0373350 A1* | 12/2017 | Bedjaoui | C09J 7/20 |
| 2018/0309097 A1 | 10/2018 | Bedjaoui et al. | |

* cited by examiner

METHOD FOR MANUFACTURING A POSITIVE ELECTRODE FOR A SOLID-STATE LITHIUM MICROBATTERY

CROSS-REFERENCE TO RELATED APPLICATIONS

This application claims priority from French Patent Application No. 1851346 filed on Feb. 16, 2018. The content of this application is incorporated herein by reference in its entirety.

TECHNICAL FIELD AND PRIOR ART

This invention relates to a method for manufacturing a positive electrode for a solid-state lithium microbattery.

Solid-state lithium microbatteries, of a thickness less than a hundred micrometres, are flexible microsystems that have good electrochemical performance (volume capacity) and a long service life. Microbatteries have become, for a few years now, indispensable components in many fields and in particular for the development of embedded intelligent systems. They have, for example, applications in the medical, space, security (smart card, for example), automobile, microelectromechanical systems (MEMS), microsensor or microelectronics fields.

Conventionally, microbatteries comprise two electrodes, a positive electrode (or cathode) and a negative electrode (or anode), separated by a solid electrolyte that is an electronic insulator but an ionic conductor. Electrodes are electrically connected to current collectors, of a metallic nature, for example, titanium, platinum or tungsten. An encapsulation layer protects the materials from air and humidity. The set of these thin layers is deposited on a substrate.

Lithium microbatteries are based on the principle of intercalation-deintercalation on the lithium ion within the electrodes.

The positive electrode is a mixed electronic and ionic conductor (for example, $LiCoO_2$, $TiOS$, $TiS_2$, $V_2O_5$). The electrolyte is an electronic insulator with a strong ionic conductivity (LiPON). The negative electrode comprises metallic lithium or lithiated materials (Li—Si, or Li—Ge for example).

The positive electrode is one of the key elements in the definition of the electrochemical performance of a microbattery.

Conventionally, the positive electrode, as the other active layers, are manufactured by thin layer deposition techniques, such as chemical vapour deposition or physical vapour deposition. In order to produce thin layers with well-defined patterns, the techniques for manufacturing a lithium microbattery use mechanical masking technologies and/or photolithography.

Masking technologies are particularly suited for components of a relatively large size (for example 1 cm×1 cm). They have limitations in the design of components of a very reduced size (a few mm$^2$) due to difficulties in the alignment of the various mask levels but especially due to their inability to correct shadow effects. Indeed, it is generally admitted that the use of stencils or mechanical masks generate a shadow effect on the edges of the patterns thus degrading the precision of the lateral definition of the layers. This limitation can be prohibitive in the production of components of reduced size (a few mm$^2$). In addition, the mechanical masking method requires the use of several mask units of which the management (cleaning, storage, replacing, etc.) becomes very complicated in an industrial process.

With regards to photolithography, the geometrical definition of the patterns is based on the principle of etching active layers chemically or dry through a temporary mask of resin arranged beforehand in direct contact with the active layers. The layer of resin of which the main role is to serve as an etching mask is then entirely suppressed chemically. Contrary to deposits by mechanical masking or stencil, the photolithography techniques make it possible to reach resolutions at the scale of a micron thus authorising the design of components of millimetric and micrometric size. One of the technical difficulties with photolithography relates to the incompatibility of the deposition/etching steps with the use of thin and ultrathin substrates. Moreover, photolithography methods suppose the multiplication of the number of technological steps which thus impacts the cost of producing components.

In addition, in order to respond to the constraints of miniaturisation while still preserving the electrochemical properties of microbatteries, the manufacturing of the cathode often requires relatively high thicknesses (greater than or equal to 10 μm) and sometimes entails post thermal annealing steps (beyond 400° C. for several hours). Thus, the structuring of the cathodic layer via standard methods using mechanical masking, photolithography or laser techniques becomes problematic and in particular in the case of thin and ultrathin substrates.

DISCLOSURE OF THE INVENTION

It is, consequently, a purpose of this invention to propose a method for manufacturing a positive electrode that is well defined, on a substrate, preferably thin or ultrathin, and the method having to be easy to industrialise.

This purpose is achieved by a method of producing a positive electrode for a solid-state lithium microbattery comprising the following successive steps:

a) supplying of a substrate, preferably thin or ultrathin, and typically made of ceramic, glass or silicon, the substrate being locally covered with a metal layer, b) depositing of a cathodic layer made of a positive electrode material, for example made of mixed lithium oxide, the cathodic layer having a thickness typically greater than 1 μm, a first portion of the cathodic layer covering the substrate and a second portion of the cathodic layer covering the metal layer, c) carrying out of a heat treatment at a temperature greater than or equal to 400° C., on the cathodic layer, in such a way as to crystallise the second portion of the cathodic layer in order to form a positive electrode, and in such a way as to delaminate the first portion of the cathodic layer.

The term "delaminate" means that the first portion of the cathodic layer loses its adhesion provoking the crumbling thereof in relation to its support substrate.

The method according to the invention makes it possible to obtain a positive electrode of which the pattern has a definition that is increased in relation to the masking techniques of prior art. The method makes it possible to carry out a cathode without using a mask (flexible in resin for photolithography or rigid for the technique using stencils).

In addition, the method makes it possible to limit the number of technological steps in relation to, in particular, those of photolithography.

The method according to the invention exploits the difference in mechanical and thermomechanical properties of cathodic layers, on the one hand, on the substrate and, on the other hand, on the metal layer. Unexpectedly, it was observed that outside the zones occupied by the metal layer, on the substrate, the deposition of the cathodic layer is powdery after the step of heat treatment at high temperature (typically at temperatures greater than or equal to 400° C.). The cathodic layer has very low adherence on the substrate made of ceramic, glass or silicon, contrary to the adherence between the cathodic layer and the metal layer, which generates a detachment of the cathodic layer outside of the metallic pattern. A simple cleaning operation makes it possible to remove the cathodic layer outside of the metallic pattern. A cathode pattern that is exclusively and correctly positioned above the metal layer is obtained. This invention makes it possible to effectively locate the deposition of the cathode of the microbatteries and limits recourse to the masking techniques of the state of the art.

The heat treatment makes it possible, advantageously, to activate the cathodic layer in order to improve its electrochemical properties, in particular by crystallising it.

Advantageously, the method comprises a subsequent step d) wherein the substrate is cleaned, for example by application of a flow of gas, in order to remove the first portion of the cathodic layer.

Advantageously, the metal layer has a thickness ranging from 100 nm to 1 µm and preferably from 100 nm to 300 nm.

Advantageously, the metal layer is made of titanium, gold, aluminium, platinum, iron, tungsten, copper or an alloy of these metals.

Advantageously, the substrate has a thickness ranging from 10 µm to 100 µm and preferably from 10 µm to 20 µm.

Advantageously, the substrate is made of yttriated zirconia.

Advantageously, the cathodic layer has a thickness ranging from 10 µm to 30 µm and preferably from 10 µm to 25 µm. The method makes it possible to carry out thick positive electrodes (typically having a thickness greater than or equal to 10 µm).

Advantageously, the cathodic layer is made of $LiCoO_2$.

Advantageously, the temperature of the heat treatment of the step c) ranges from 400° C. to 800° C., and preferably, from 500° C. to 700° C.

Advantageously, the duration of the heat treatment of the step c) ranges from 15 seconds to 24 h, and preferably from 1 h to 10 h, for example from 2 h to 5 h.

Advantageously, the cathodic layer is deposited by cathodic sputtering.

The invention also relates to a method for manufacturing a solid-state lithium microbattery comprising the following successive steps:

i. carrying out of the steps a) to c) such as defined hereinabove, in such a way as to form a positive electrode, ii. forming of a thin layer of solid electrolyte on the positive electrode, iii. forming of a negative electrode on the thin layer of electrolyte iv. forming of a metal anodic current collector, the anodic current collector being in contact with the negative electrode.

According to a first advantageous alternative, the method comprises an additional step between the step i and the step ii wherein a cathodic current collector, in contact with the positive electrode is formed.

According to a second advantageous alternative, the method comprises an additional step after the step i or after the step iv wherein the metal layer is rendered accessible by etching in order to carry out a resuming of contact.

According to a third advantageous alternative, vias are carried out through the substrate in such a way as to carry out an electrical connection on the metal layer through the substrate.

BRIEF DESCRIPTION OF THE DRAWINGS

This invention shall be better understood on the basis of the following description and of the accompany drawings wherein.

The different portions shown in the figures are not necessarily shown according to a uniform scale, in order to render the figures more legible.

The different possibilities (alternatives and embodiments) must be understood as not being exclusive of one another and able to be combined together.

DETAILED DISCLOSURE OF PARTICULAR EMBODIMENTS

In the following detailed description, given for the purposes of information and in a non-limiting manner, the method is primarily described for carrying out a positive electrode 32 (cathode) made from cobalt oxide for a lithium microbattery comprising a ceramic substrate. However, those skilled in the art can apply this teaching to other substrate and/or electrode materials.

Reference is first made to FIGS. 1 to 5.

Figure 1:
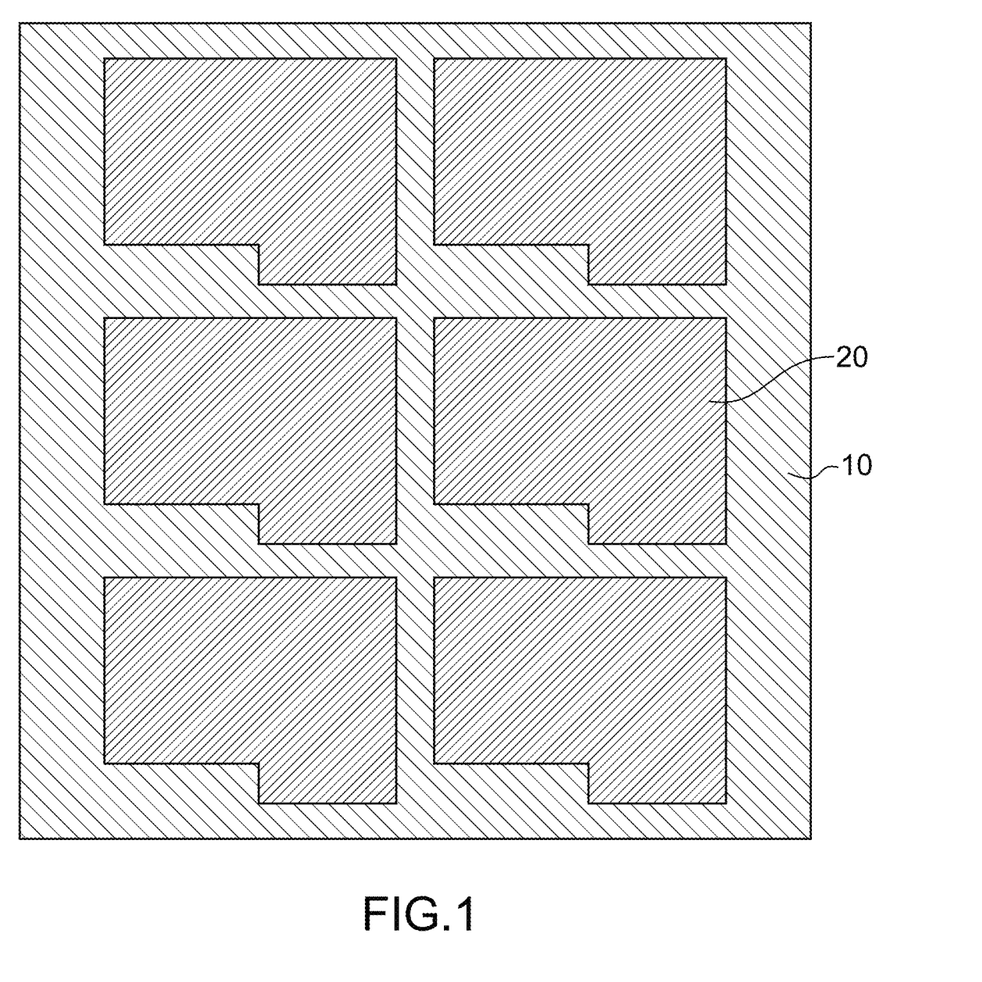
FIGS. 1 to 5 show, diagrammatically, different steps of the method for manufacturing a positive electrode, according to a particular embodiment of the invention.
Figure 2:
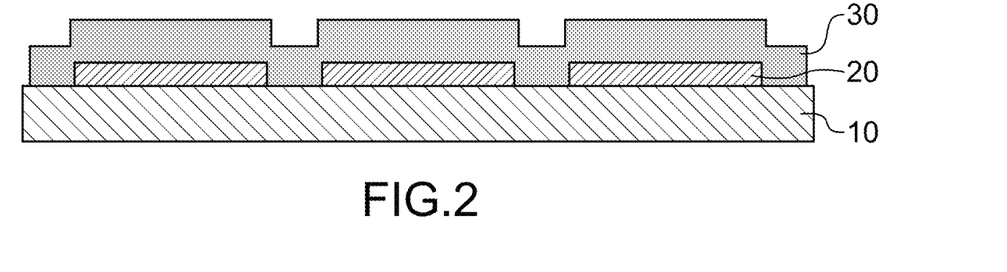
Figure 4:
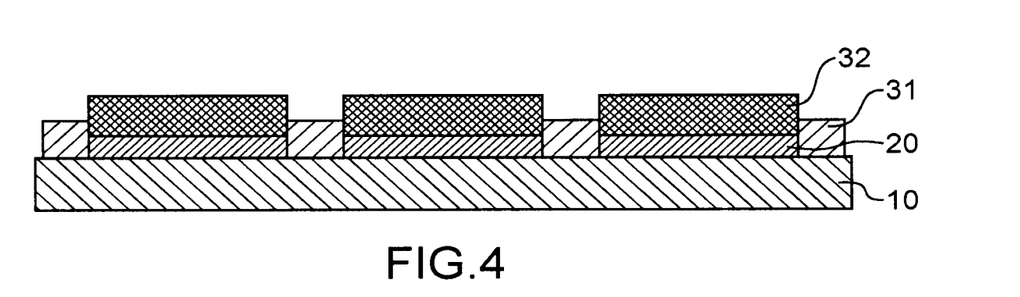
Figure 5:
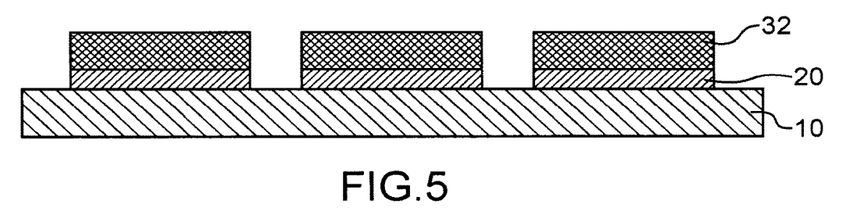

The method for producing a positive electrode 32 for a solid-state lithium microbattery comprises the following successive steps:

a) supplying of a substrate 10, typically thin or ultrathin, made of ceramic, glass or silicon, locally covered with a metal layer 20, (FIG. 1)

b) deposition of a cathodic layer 30 made of a positive electrode material, for example made of mixed lithium oxide, the cathodic layer 30 having a thickness greater than 1 µm, a first portion 31 of the cathodic layer 30 covering the substrate 10 and a second portion 32 of the cathodic layer 30 covering the metal layer 20, intended to form the positive electrode 32, (FIG. 2)

c) carrying out of a heat treatment at a temperature greater than or equal to 400° C., on the cathodic layer 30, in such a way as to crystallise the second portion of the cathodic layer 30 in order to form a positive electrode 32, and in such a way as to delaminate the first portion 31 of the cathodic layer 30, (FIGS. 3 and 4), d) preferably, cleaning of the substrate 10, for example by application of a flow of gas, so as to remove the first portion 31 of the cathodic layer 30 (FIG. 5).

The Substrate 10

Those skilled in the art will choose a substrate 10 suitable for the carrying out of microbatteries. For example, the substrate 10 can be made from ceramic, silicon, or glass.

The silicon can be monocrystalline or polycrystalline.

The glass can be chosen from borosilicates (such as, for example, the references D263®LA, D263®M, D263®T, MEMpax® or Borofloat® marked by)SCHOTT®, derivatives of borosilicates such as glasses of the "alkali-free borosilicates" type (AF32®, AF45, Corning® Willow . . . ) or glasses of the boro-aluminosilicate type ("alkaline earth boro-aluminosilicates") marketed for example by Corning Lotus™, EAGLE XG®.

Preferably, the substrate 10 made from glass is transparent to the wavelengths of the lasers conventionally used for the cutting steps. The term transparent means that the substrate 10 allows at least 50% of the light emitted by the laser to pass.

The substrate 10 provided in the step a) is, preferably, a substrate 10 made of ceramic. Preferably it is an yttriated zirconia. This material has thermomechanical properties that are suited to the method. The substrate 10 has, for example, a thermal expansion coefficient of $8 \times 10^{-6}/°$ C. at ambient temperature and a Young's modulus of 200 GPa. It also has very good thermal stability at 1000° C., and a thermal expansion coefficient of $11 \times 10^{-6}/°$ C. at 1000° C. that are compatible with the methods of carrying out electrodes at high temperature for lithium microbatteries. The substrate 10 initially has a compressive residual stress of 250 GPa at ambient temperature (20-25° C.).

This is a thin substrate 10 having a thickness less than 100 µm, or an ultrathin substrate 10 having a thickness less than 50 µm. The substrate 10 has, for example, a thickness of 20 µm. For example, the substrate 10 has a thickness ranging from 10 µm to 100 µm and preferably from 10 µm to 20 µm.

For example, a substrate 10 made of ceramic of the "Thin E-Strate" type marketed by ENrG with a thickness of 20 µm can be used.

The substrate 10 comprises a first face, a second face and a lateral face. The second face is opposite the first face. The first face is covered by the metal layer, this is the face referred to as the front face or active face. The second face is the rear face.

The Metal Layer 20

As shown in FIG. 1, the first face of the substrate 10 is covered locally by a metal layer 20. The substrate 10 is, preferably, covered by several metallic layers, arranged in the same plane parallel to the surface of the substrate 10. The metallic layers form metallic islands.

The metal layer 20 is, preferably, in direct contact with the substrate 10. There is no element between the metal layer 20 and the substrate 10.

The metal layer 20 is mechanically robust so as to support the other layers that will be subsequently formed and not impact the mechanical properties of the upper layers.

The metal layer 20 has very low stresses in compression/tension (Young's modulus<500 MPa) compared to the other elements of the structure (substrate 10, cathode 32).

The metal layer 20 is, for example, made of titanium, gold, aluminium, platinum, iron, tungsten, copper or of an alloy of these metals. The metal layer 20 can also be a metallic bilayer. It could also include other metallic layers.

The thickness of the metal layer 20 ranges from a few nanometres to a few micrometres. It has, for example, a thickness ranging from 100 nm to 1 µm and preferably from 100 nm to 300 nm.

For example, the metal layer 20 is a bilayer comprising a layer of titanium (for example 50 nm thick) and a layer of platinum (for example 250 nm thick). The role of the layer of titanium is to improve the catching and the adhesion of the layer of platinum on the substrate 10 made of ceramic. The layer of platinum provides the properties of resistance to oxidation under the effect of the thermal annealing which are intrinsically better than the properties of a layer of titanium alone. In addition, these two materials have mechanical properties that are rather close with thermal expansion coefficients located between $8 \times 10^{-6}/°$ C. and $9 \times 10^{-6}/°$ C. and Young's moduli in the range 100 to 200 GPa. In addition, the layer has an intrinsic residual stress that is relatively low in comparison with the substrate 10 (typically less than 1 GPa).

The metal layer 20 can be carried out by conventional techniques such as cathodic sputtering or physical vacuum deposition by using the mechanical masking techniques (alternatively of photolithography or laser) in order to give it the desired shape.

The metal layer 20 can be used according to specific configurations/patterns that delimit the deposition zones of the cathodic layer 30.

Advantageously, the metal layer 20 can play the role of a cathodic current collector 21.

The Cathodic Layer 30

During the step b), a cathodic layer 30 is deposited on the substrate 10 and on the metal layer 20 (FIG. 2).

The portion of the cathodic layer 30 deposited on the metal layer 20 is intended, to form after the heat treatment of the step c), the positive electrode 32.

The cathodic layer 30 is made from a material that has good electronic and ionic conductivity. Advantageously, a material that requires a thermal annealing will be chosen in order to improve its electrochemical properties (activation).

It can be made from TiOS, $V_2O_5$, $TiS_2$, from a lithiated transition metal oxide such as $LiCoO_2$, $LiTiS_2$, Li(Ni, Co, Mn)$O_2$ (NMC), or Li(Ni, Co, Al)$O_2$ (NCA), or from a lithiated iron phosphate or a lithiated titanium oxysulfide (LiTiOS). Preferably, it is made of $LiCoO_2$ which has good electrochemical performance.

The cathodic layer 30 has, for example, a compliant thickness.

It has a thickness greater than 1 µm and more preferably greater than or equal to 10 µm in order to form so-called thick electrodes. It has, for example, a thickness ranging from 10 µm to 30 µm and preferably from 10 µm to 25 µm.

The cathodic layer 30 can be chemically deposited, by chemical vapour deposition or by physical vapour deposition (PVD). The deposition can be followed by a heat treatment.

Preferably, the cathodic layer 30 is obtained by cathodic sputtering from a target. This technique consists in applying a difference in potential between the walls of a reactor and of a target (called cathode), located inside the reactor, in such a way as to ionise the atmosphere of the reactor and create a plasma. Under the effect of the electric field, the positive species of the plasma (such as for example the ions $Ar^+$ ions) will bombard the target. The atoms which are ejected from the target are deposited on a substrate 10. The layer deposited has a chemical composition that is identical or close to that of the target. This technique is particularly interesting since it makes it possible to obtain thin films at low temperature and can therefore be used on any type of substrate 10 (silicon, polymer, etc). The thermal heating induced by the sputtering deposition remains relatively contained within values below 400° C.

For example, after deposition, the cathodic layer 30 made of $LiCoO_2$ has a compressive residual stress of which the values are of about a few giga pascal as well as an elasticity modulus that has values between 100 and 300 GPa according to the conditions of elaboration. In addition, it has thermal expansion coefficients that vary from $10\times10^{-6}/°$ C. to $15\times10^{-6}/°$ C. in the temperature range from 25 to 400° C. The internal stresses (value and gradient where applicable) depend on the material and on its method of elaboration, in particular physical conditions that govern the growth of thin layers. Generally, the cathodic layers that are recommended in the framework of this invention are oxides of the $Li_xM_yO_z$, type (M being a transition metal such as Fe, Mn, Co, Ni, Ta, Nb, etc.). These materials that can be used to form the positive electrode have the advantage of containing lithium which makes it possible to use a non-lithiated material as a negative electrode. For the negative electrode, it is possible to use at least one of the following layers: $LiMn_2O_4$, $LiFePO_4$, $LiTaO_3$, $LiNbO_3$, etc. By way of example alternative to $LiCoO_2$, an electrode made of $LiMn_2O_4$ can be deposited with cathodic sputtering techniques and with temperatures of about 600° C. to 700° C. The residual stress of this type of layer varies between 100 and 150 GPa and its thermal expansion coefficient is about $10\times10^{-6}/°$ C. However, the most commonly used metal oxide remains lithiated cobalt oxide ($LiCoO_2$) for its electrochemical properties and its method of implementation that is highly advantageous in relation to other oxides.

The residual stresses of a compressive nature induced by the formation of the cathodic layer 30 on the substrate 10 lead to a slight delamination of this portion of the layer made of $LiCoO_2$. The layer tends to curve upwards.

Thermal Annealing

The step of deposition of the cathodic layer 30 (step b)) is followed by a step of thermal annealing (step c)) of which the main purpose is to crystallise the layer of $LiCoO_2$ and to obtain the desired electrochemical behaviour.

Figure 3:
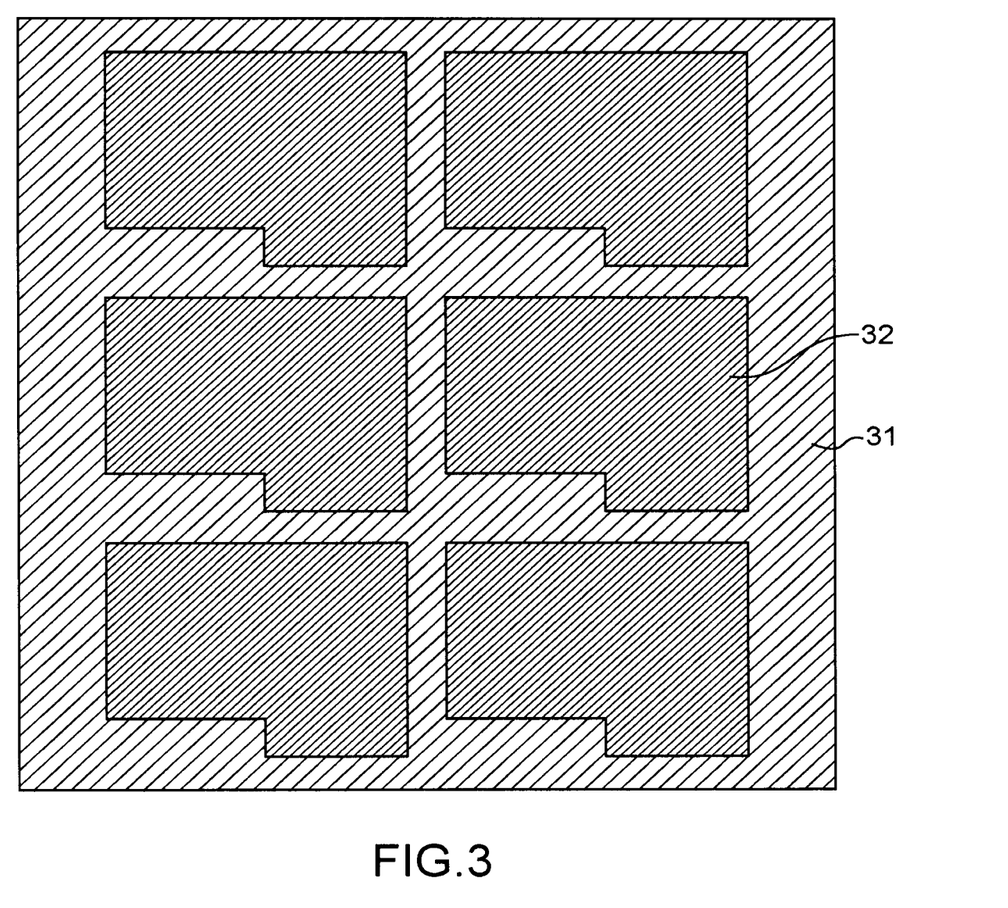

The step of annealing leads at the same time to a complete and clear delamination of the portion 31 of the cathodic layer 30 that is in direct contact with the substrate 10. This portion 31 of the layer has a powdery aspect, after the thermal annealing. The portion of the cathodic layer 30 in contact with the metallic layers does not undergo these deformations, it remains adherent with the metal layer 20 and results in the formation of a positive electrode 32 (FIGS. 3 and 4).

The duration of the annealing ranges for example from 15 seconds to 5 hours. It can be 2 h.

The temperature of the annealing ranges for example from 400° C. to 800° C., and preferably, from 500° C. to 700° C. It can be 600° C.

The annealing can be carried out under air.

The step of deposition followed by the step of annealing leads to a self-structuring of the cathodic layer 30. The thermal annealing of crystallisation induces a gradient of stresses without needing to call upon additional techniques (masking). Indeed, the combination of the intrinsic residual stresses and residual stresses of thermal origin such that of mechanical behaviours of the portion of the cathodic layer 30 formed on the substrate 10 and the portion of the cathodic layer 30 formed on the metal layer 20 are significantly different. The incompatibility of the thermal dilatations and the difference in the elasticity properties between the layer and the substrate 10 create a mechanical cycling in the cathodic layer 30 made of $LiCoO_2$ that can result in a releasing of the compressive stresses and the layer finishes by curving downwards. The loss of adhesion between the cathodic layer 30 and the substrate 10 outside of the zones delimited by the metal layer 20 can result from a possible relaxing of the compressive stress under the effect of the thermal annealing.

Generally, the stress gradients can result in an irreversible curving of the elaborated structures. The role of the metallic layers is to ensure a certain reversibility of the structure formed by the triple substrate 10/cathodic layer 30/metal layer 20 by absorbing the effects of the releasing of the stresses caused by the methods of thermal annealing.

The direct deposition of a cathodic layer 30 procures a behaviour in tension of the unit formed by the thin substrate 10 and the layers deposited (metal layer 20 and cathode 32). Due to the thickness and the intrinsic thermomechanical properties of the cathodic layer 30, the thermal annealing would feed a compressive effect of the unit of the thin substrate 10 and deposited layers. The compressive effect generated by the thermal annealing is much more preponderant for thick cathodic layers (>10 μm) and ultrathin substrates 10 (<50 μm). The inversion in the behaviour (tension to compression) of the structure formed by the substrate 10, the metal layer 20 (of which the main role is to serve as cathodic current collectors) and the cathodic layer 30 under the effect of the thermal annealing generates a detachment of the cathodic layer 30 arranged in direct contact with the surface of the thin substrate 10 made of ceramic except for the zones protected by metallic deposits. In this case, the metallic pattern also acts as an absorber by compensating the differences on thermomechanical stresses between on one side the cathodic layer 30 and on the other side the thin substrate 10 made of ceramic.

Those skilled in the art will choose the various parameters for carrying out the method, such as the characteristics of the substrate 10 (thickness, thermal expansion coefficient), of the cathodic layer 30 (thickness, thermal expansion coefficient), and of the heat treatment (temperature, duration) according to the desired tensile/compressive stresses.

The powdery residues of the portion of the layer 31 can then be removed with a method of blowing, for example under dry air (FIG. 5).

Figure 6:
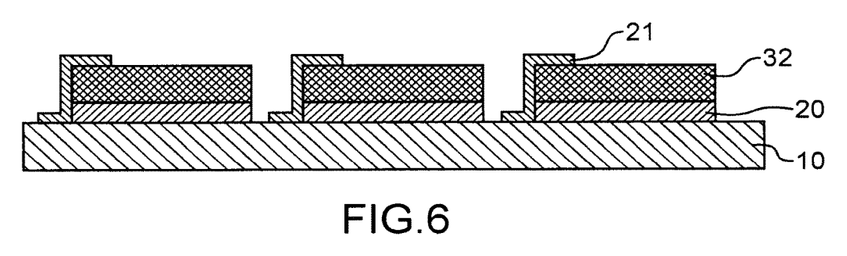
FIGS. 6 and 7 show, diagrammatically different steps of the method of manufacturing a microbattery, according to a particular embodiment of the invention.
Figure 7:
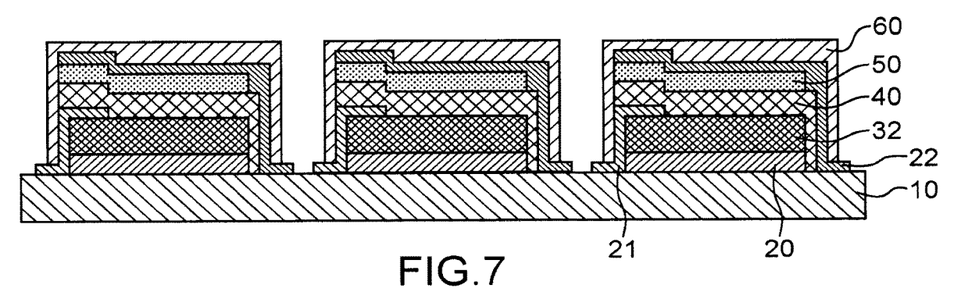

The method for manufacturing a positive electrode 32 is, advantageously, implemented for manufacturing a solid-state lithium microbattery, as shown in the FIGS. 6 and 7 as well as 8A to 8D. The method for manufacturing the microbattery comprises the following successive steps:

i. carrying out of the steps a) to c) such as defined hereinabove, in such a way as to form a positive electrode 32, ii. forming of a thin layer of solid electrolyte 40 on the positive electrode 32, iii. forming of a negative electrode 50 on the thin layer of electrolyte 40 iv. forming of a metallic anodic current collector 22, the anodic current collector 22 being in contact with the negative electrode 50.

The Solid Electrolyte Layer 40

The solid electrolyte layer 40 is an electronic insulator material that has a strong ionic conductivity. For example, it is a thin layer made of LiPON (Lithium Phosphorous OxyNitride), LiSiPON (Nitrogen-incorporated Lithium SilicoPhosphate), LiSON (Lithium Sulfur Oxynitride), LiPONB, or LiSiCON (Li Super Ionic Conductor).

This layer can be formed by cathodic sputtering (PVD) in order to obtain a continuous layer, of very low thickness (for example 1.5 µm thick), without defects. It can be deposited through a set of dedicated masks in such a way as to cover the cathode 32, a portion of the substrate 10 and a portion of the cathodic collector.

The Negative Electrode 50 (Anode)

The negative electrode 50 can be metallic lithium, graphite, a metal alloy with a lithium base, or an insertion compound such as $Li_4Ti_5O_{12}$.

The negative electrode 50 can be made of lithium by secondary vacuum evaporation by heating metallic lithium. A lithium film is thus obtained, of which the thickness varies from 1 to 3 µm, arranged in such a way as to be in contact solely with the electrolyte. In order to ensure a better circulation of the anodic current, one or several specific levels of specific metallisation can be required.

The Anodic Current Collector 22

The anodic current collector 22 is, advantageously, metallic and can be, for example, with a base of titanium, tungsten, nickel, platinum, copper or gold. It could also be made of aluminium or copper or a mixture of several metals.

The anodic current collector 22 can be deposited by cathodic sputtering through a mask (FIG. 7).

Figure 8A:
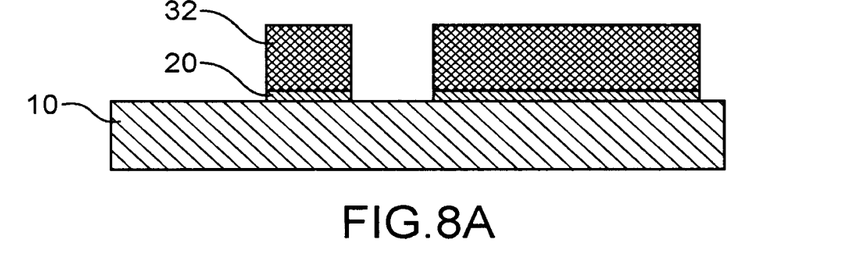
FIGS. 8A to 8D show, diagrammatically different steps of the method of manufacturing a microbattery, according to a particular embodiment of the invention.
Figure 8B:
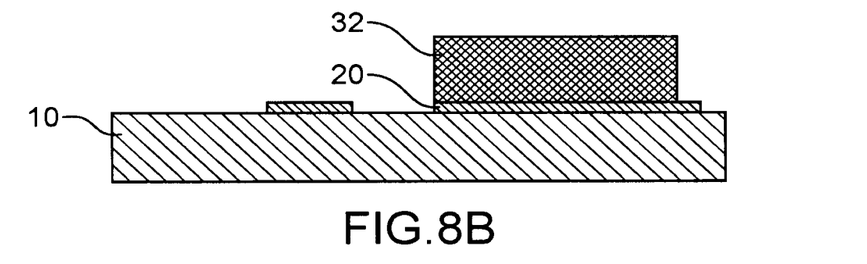
Figure 8C:
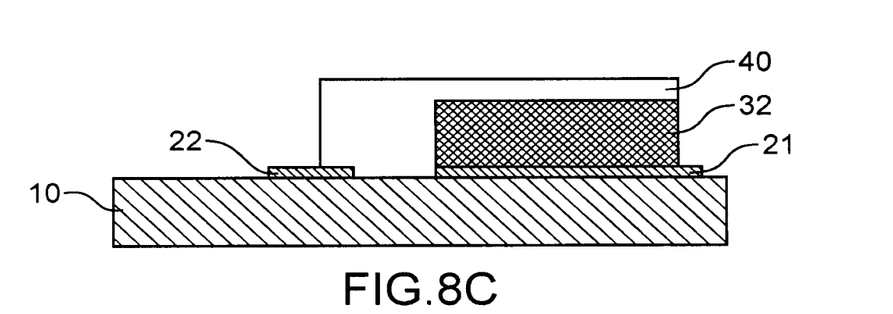
Figure 8D:
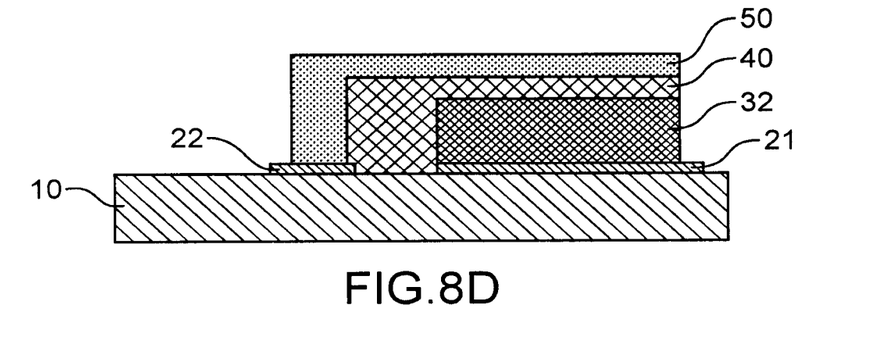
Figure 9:
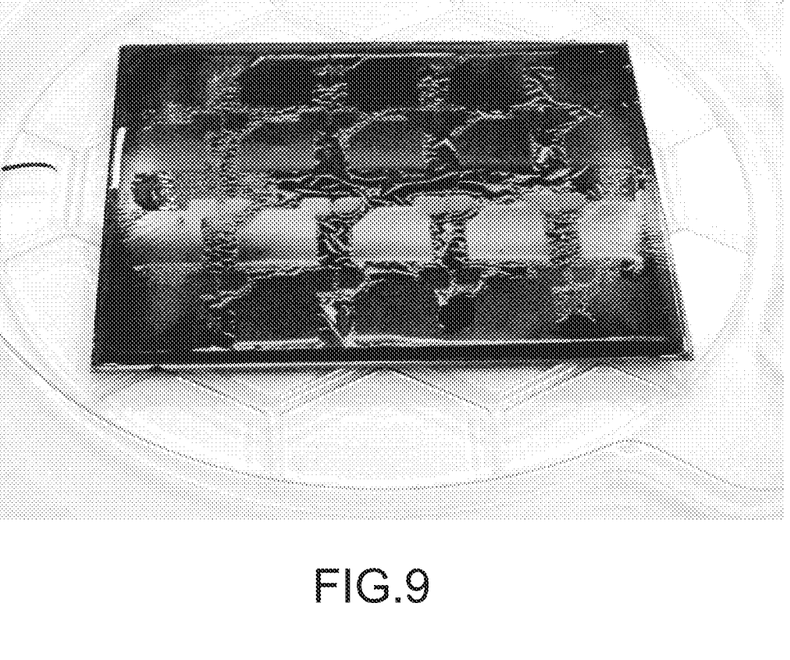
FIG. 9 is a photographic snapshot showing a layer of $LiCoO_2$ 7 µm thick deposited on a substrate locally covered with metallic layers, after heat treatment, according to a particular embodiment of the invention.
Figure 10:
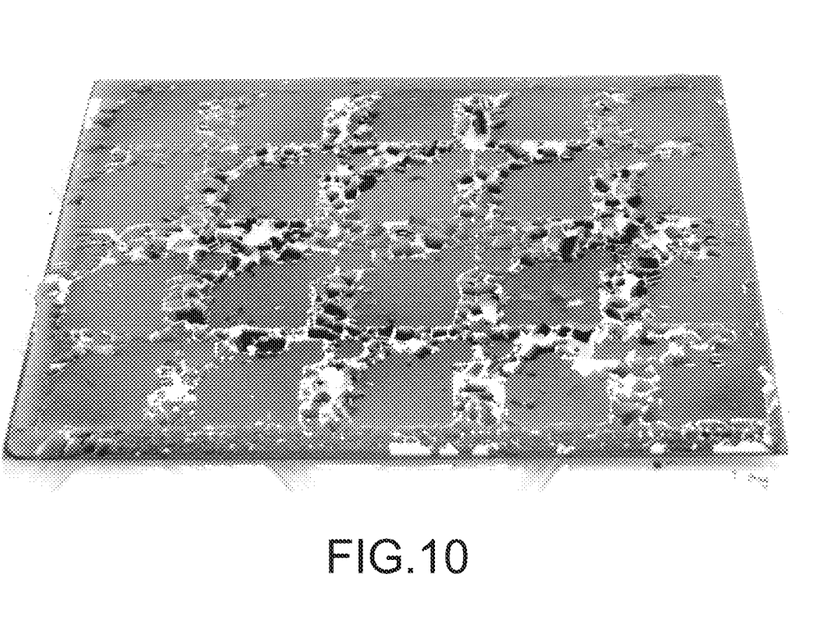
FIG. 10 is a photographic snapshot showing a layer of $LiCoO_2$ 21 µm thick deposited on a substrate locally covered with metallic layers, according to a particular embodiment of the invention.

A portion of the metal layer 20 can be used to form the anodic current collector 22 (FIGS. 8A to 8D). For this, several metallic layers 20 will be deposited on the substrate 10. After formation of positive electrodes 32 on the various metallic layers 20, by the method such as described previously (FIG. 8A), certain electrodes will be etched by any suitable technique, in such a way as to render accessible certain metallic layers (FIG. 8B). The metallic layers covered by the positive electrodes will play the role of a cathodic current collector 21 while other metallic layers will play the role of anodic current collector 22 (FIG. 8D).

The Cathodic Current Collector 21

The positive electrode 32 is in contact with a cathodic current collector 21. The current collector can be on the positive electrode 32 or under the positive electrode 32.

In the first alternative, the current collector locally covers the positive electrode 32 (FIGS. 6 and 7). A covering will be chosen such that it makes it possible to benefit from a large active surface of the cathodic layer 30 while still leaving enough surface free for the subsequent deposition of the solid electrolyte.

To obtain such a configuration, the method can include an additional step between the step i and the step ii wherein the cathodic current collector 21, in contact with the positive electrode 32 is formed.

The second alternative correspond to the case where the metal layer 20 plays the role of a current collector 22 (FIGS. 8A to 8D).

The releasing of the cathodic contacts can be done at the end of the method for carrying out microbatteries with ablation techniques, for example via laser etching, so as to create a zone on the metal layer 20 that allows for resumed contact on the front face.

Such a configuration consists in carrying out an additional step, after the step i or after the step iv, wherein the metal layer 20 is rendered accessible by etching so as to carry out the resuming of contact.

The step of opening cathodic contacts can possibly be carried out immediately after the formation of the cathodic layers (FIG. 8B). The zone can be obtained after a laser flux (wavelength in green 530 nm and a power between 10 and 40 µJ).

The access to the cathodic contacts can also be done through the substrate 10, on the rear face, by the creation of through vias at the end of the method of carrying out microbatteries or upstream of the steps of deposition of the various layers. This configuration, not shown, offers the possibility of carrying out functional stacks via 3D integration.

Generally, the material of the current collector must be a very good electronic conductor. Thus, we can use a material of the same nature as that of the metal layer 20 or a different material. The current collector is, preferably, metallic. It is, for example, with a base of titanium, tungsten, nickel, platinum, copper or gold.

It has, for example, a thickness ranging from 10 nm to 1000 nm and more preferably entre 100 and 500 nm.

A cathodic current collector 21 made of platinum with a thickness of 250 nm can be used.

The current collector can be obtained by any type of thin layer deposition techniques such as PVD with a mechanical masking technique.

The Encapsulation Layer 60

The layers described hereinabove, and in particular the negative electrode 50 made of lithium as well as the other layers with a lithium base, can be protected from the air, by an encapsulation layer 60 (FIG. 7).

The encapsulation layer 60 can be obtained by a localised deposition of an alternating of layer of polymer, such as acrylates or epoxides, and a layer made of a barrier material, such as nitride or oxide alumina.

The electrical contacts of the microbatteries are not shown in the figures.

Illustrative and Non-Limiting Examples of an Embodiment

The cathodic layer 30 was obtained by carrying out the following successive steps:

- carrying out of a series of pads from a deposition of a metal layer 20 with a thickness of 300 nm on a host substrate 10 made of ceramic 20 µm thick,
- carrying out of a full substrate deposition and without a mask of a cathodic layer 30 made of lithium cobalt oxide ($LiCoO_2$) 20 µm thick,
- carrying out of heat treatment operations suitable for the thickness and the composition of the electrodes made of $LiCoO_2$ at a temperature greater than 400° C. and more preferably greater than 600° C. for a duration of 2 h,
- carrying out of a cleaning action of the substrate 10 by the application of a flow of air or neutral gas in order to suppress the residues of the cathodic layer 30 that is outside of the zones delimited by the pattern of the metallic pads 20.

The invention claimed is:

1. Method for producing a positive electrode for a solid-state lithium microbattery comprising the following successive steps:
   a) supplying of a substrate locally covered with a metal layer;
   b) depositing of a cathodic layer made of a positive electrode material, a first portion of the cathodic layer covering the substrate and a second portion of the cathodic layer covering the metal layer;
   c) carrying out of a heat treatment at a temperature greater than or equal to 400° C., on the cathodic layer, in such a way as to crystallise the second portion of the cathodic layer in order to form a positive electrode, and in such a way as to delaminate the first portion of the cathodic layer; and
   d) wherein the substrate is cleaned in order to remove the first portion of the cathodic layer.

2. Method according to claim 1, wherein the metal layer has a thickness ranging from 100 nm to 1 μm.

3. Method according to claim 1, wherein the metal layer has a thickness ranging from 100 nm to 300 nm.

4. Method according to claim 1, wherein the metal layer is made of titanium, gold, aluminium, platinum, iron, tungsten, copper or an alloy of these metals.

5. Method according to claim 1, wherein the substrate has a thickness ranging from 10 μm to 100 μm.

6. Method according to claim 1, wherein the substrate is made of ceramic, glass or silicon.

7. Method according to claim 1, wherein the substrate is made of yttriated zirconia.

8. Method according to claim 1, wherein the cathodic layer has a thickness greater than 1 μm.

9. Method according to claim 1, wherein the cathodic layer has a thickness ranging from 10 μm to 30 μm.

10. Method according to claim 1, wherein the cathodic layer is made of a lithiated transition metal oxide.

11. Method according to claim 1, wherein the cathodic layer is made of $LiCoO_2$.

12. Method according to claim 1, wherein the temperature of the heat treatment of the step c) ranges from 400° C. to 800° C.

13. Method according to claim 1, wherein the duration of the heat treatment of the step c) ranges from 15 seconds to 24 hours.

14. Method according to claim 1, wherein the cathodic layer is deposited by cathodic sputtering.

15. Method of manufacturing a solid-state lithium microbattery comprising the following successive steps:
   i. carrying out of the steps a) to c):
      a) supplying of a substrate locally covered with a metal layer,
      b) depositing of a cathodic layer made of a positive electrode material, a first portion of the cathodic layer covering the substrate and a second portion of the cathodic layer covering the metal layer,
      c) carrying out of a heat treatment at a temperature greater than or equal to 400° C., on the cathodic layer, in such a way as to crystallise the second portion of the cathodic layer in order to form a positive electrode, and in such a way as to delaminate the first portion of the cathodic layer,
   ii. forming of a thin layer of solid electrolyte on the positive electrode,
   iii. forming of a negative electrode on the thin layer of electrolyte,
   iv. forming of a metal anodic current collector, the anodic current collector being in contact with the negative electrode; and
   d) wherein the substrate is cleaned in order to remove the first portion of the cathodic layer.

16. Method according to claim 15, comprising an additional step between the step i and the step ii wherein a cathodic current collector, in contact with the positive electrode is formed.

17. Method according to claim 15, comprising an additional step after the step i wherein the metal layer is rendered accessible by etching in order to carry out a resuming of contact.

18. Method according to claim 15, comprising an additional step after the step iv wherein the metal layer is rendered accessible by etching in order to carry out a resuming of contact.

19. Method according to claim 15, wherein vias are carried out through the substrate in such a way as to carry out a resuming of contact on the metal layer through the substrate.

20. Method according to claim 1, wherein the second portion of the cathodic layer is deposited to entirely cover the metal layer.

* * * * *